United States Patent [19]

Moore et al.

[11] Patent Number: 5,514,969
[45] Date of Patent: May 7, 1996

[54] IMPEDANCE MEASUREMENT IN A HIGH-VOLTAGE POWER SYSTEM

[75] Inventors: Robert E. Moore, San Jose; Frederic W. Nitz, Boulder Creek, both of Calif.

[73] Assignee: Reliable Power Meters, Inc., Los Gatos, Calif.

[21] Appl. No.: 248,280

[22] Filed: May 24, 1994

[51] Int. Cl.$^6$ .............................. G01R 27/02; G06G 7/48
[52] U.S. Cl. .............................................. 324/603; 364/578
[58] Field of Search ...................................... 324/522, 602, 324/603, 86; 364/578, 481, 495

[56] References Cited

U.S. PATENT DOCUMENTS

| | | | |
|---|---|---|---|
| 3,534,400 | 10/1970 | Dahlin | 364/578 |
| 3,832,533 | 8/1974 | Carlson et al. | 364/578 |
| 3,883,724 | 5/1975 | Pradhan et al. | 364/578 |
| 5,298,853 | 3/1994 | Ryba | 324/86 |

OTHER PUBLICATIONS

Osmolovskiy et al, Telecommunications and Radio Engineering Vol. 27/88 5/73 364/495.

Gibbs et al. Power Plant Training Simulator 7/1976 364/495.

Galanos et al. IEEE Power Engineering Winter Meeting 2/1977 364/495.

*Primary Examiner*—Mauba K. Regan
*Attorney, Agent, or Firm*—Townsend and Townsend and Crew

[57] ABSTRACT

A power monitoring instrument evaluates and displays the source impedance, load impedance, and distribution system impedance of an alternating current power system using voltage and current measurements taken at a source and load of the power system. The power monitoring instrument and associated voltage and current pods for coupling to voltage probes and current clamps incorporate unique safety features to minimize operator exposure to high-voltage. The measurements are performed noninvasively without disconnecting elements of the power system. Evaluation of impedances takes advantage of incidental variations in the load characteristics.

1 Claim, 12 Drawing Sheets

| PHASE | VOLTS | ANGLE |
|---|---|---|
| 1 → A | 110V | 0° |
| 2 → B | 111.7V | 240° |
| 3 → C | 112.1V | 120° |

| PHASE | VOLTS | ANGLE |
|---|---|---|
| 1 → A | 110V | 0° |
| 3 → B | 112.1V | 120° |
| 2 → C | 111.7V | 240° |

| PHASE | | AMPS | ANGLE |
|---|---|---|---|
| 1 | A | 13V | 0° |
| 2 | B | 12.8V | 110° |
| 3 | C | 13.1V | 65° |

| PHASE | | AMPS | ANGLE |
|---|---|---|---|
| 1 | A | 13V | 0° |
| 2 | B | 12.8V | 110° |
| 3 | C | 13.1V | 245° |

IMPEDANCE MEASUREMENT IN A HIGH-VOLTAGE POWER SYSTEM

BACKGROUND OF THE INVENTION

This invention relates generally to an apparatus and method for conveniently measuring impedances in a high voltage alternating current power system while minimizing operator exposure to dangerous voltage levels.

In troubleshooting a high voltage power system such as the power system of a building, it is often useful to analyze impedance characteristics, whether of a power source, load, or intermediate wiring. For reliable performance, the source impedance should be less than 1/20 the distribution and load impedances. As the source impedance increases relative to the load impedance, the voltage delivered to the load decreases and voltage waveform distortion can develop.

Prior art impedance measurement techniques are cumbersome and invasive. For example, measuring the impedance of a source requires disconnecting the source from its load and substituting an adjustable test load. Impedance is then derived from changes in source voltage resulting from varying currents drawn by the load.

Furthermore, performing the necessary voltage and current measurements in a high-voltage environment poses safety problems. If the power monitoring instrument is located adjacent to the points to be monitored, the operator is exposed to the danger of electrical shock for a long time. If the voltage probes and current clamps coupled to the necessary monitoring points are remote from the power monitoring instrument, shuttling between the instrument and probes is necessary to assure that contact has been made by the voltage probes and that the current clamps are secured in the desired orientation. Repeated visits to the monitoring points and handling of the probes and clamps increase the risk of shock. The problem is exacerbated when a multiphase power system is to be monitored and probes or clamps may be accidentally coupled to the wrong phase.

Danger is also presented by the need to handle high-voltage connections to differential inputs at the rear of the power monitoring instrument. When struggling under protective clothing in a hot equipment closet, or in cold weather, it is easy to short phases together or to neutral with a jumper cable.

What is needed is a non-invasive apparatus and method for determining impedances of a source and load in a high-voltage power system. The apparatus and method should be convenient and should minimize operator exposure to danger of shock when performing the necessary measurements.

SUMMARY OF THE INVENTION

In accordance with the invention, a power monitoring instrument evaluates and displays the source impedance, load impedance, and distribution system impedance of an alternating current power system using voltage and current measurements taken at a source and load of the power system. The power monitoring instrument and associated voltage and current pods for coupling to voltage probes and current clamps incorporate unique safety features to minimize operator exposure to high-voltage. The measurements are performed noninvasively without disconnecting elements of the power system. Evaluation of impedances takes advantage of incidental variations in the load characteristics.

The power monitoring instrument of the invention monitors load impedance, defined as the ratio of rms voltage to rms current, for successive cycles of an alternating current signal generated by the power source to identify a pair of cycles with disparate load impedances. The source impedance is determined from the ratio of the change in rms voltage to the change in rms current between the cycles of the identified pair.

Successive estimates of source impedance are generated and stored for successive identified pairs of cycles having disparate load impedances. Cumulative statistical data is maintained for the stored source impedance estimates and the mean source impedance is displayed once the stored estimates show long-term consistency as evidenced by a low standard deviation.

A complete impedance diagram of a power system can be generated by determining source impedance at the utility service entrance or point of common coupling in accordance with the invention and then repositioning probes and clamps to measure voltage and current at the load. Load impedance is then evaluated to be the ratio of load voltage to load current. An apparent source impedance is evaluated at the load by applying the techniques described to determine source impedance to measurements made at the load. The distribution system impedance can then be derived by subtracting the source impedance as measured at the point of common coupling from the apparent source impedance as measured at the load. The complete wiring diagram including source impedance, load impedance, and distribution system impedance is then generated and displayed, facilitating troubleshooting and analysis.

To minimize operator exposure to high voltage when physically attaching probes to perform the necessary measurements, the power monitoring instrument of the invention incorporates unique safety features. A voltage pod is coupled to the power monitoring instrument by a connection cable. The voltage pod connects via signal leads to a plurality of voltage probes. Resistive dividers are incorporated into the pod so that high-voltage is not present at the instrument. LEDs corresponding to each voltage probe are incorporated into the pod. An illumination of an LED indicates a live connection so the operator need not shuttle between the instrument and probes to verify good contact.

In accordance with the invention, a current pod is coupled to the power monitoring instrument by a lengthy connection cable. The current pod is connected by signal cables to a plurality of current monitoring clamps. The current pod also incorporates an LED for each associated current clamp and a steady illumination of the LED indicates good coupling between the clamp and a conductor to be monitored while a flashing of the LED indicates an over-range condition.

Circuitry within the power monitoring instrument allows an operator to correct for inadvertent misconnection to phase conductors by the current clamps or voltage probes by entering special commands. Similarly, corrections may also be made for misoriented current monitor clamps. In addition to enhancing safety, the ability to correct connections without handling probes and clamps provides convenience in that shuttling between the power monitoring instrument and monitoring points is reduced.

The invention will be better understood upon reference to the following detailed description in connection with the accompanying drawings.

DESCRIPTION OF SPECIFIC EMBODIMENTS

Figure 1:
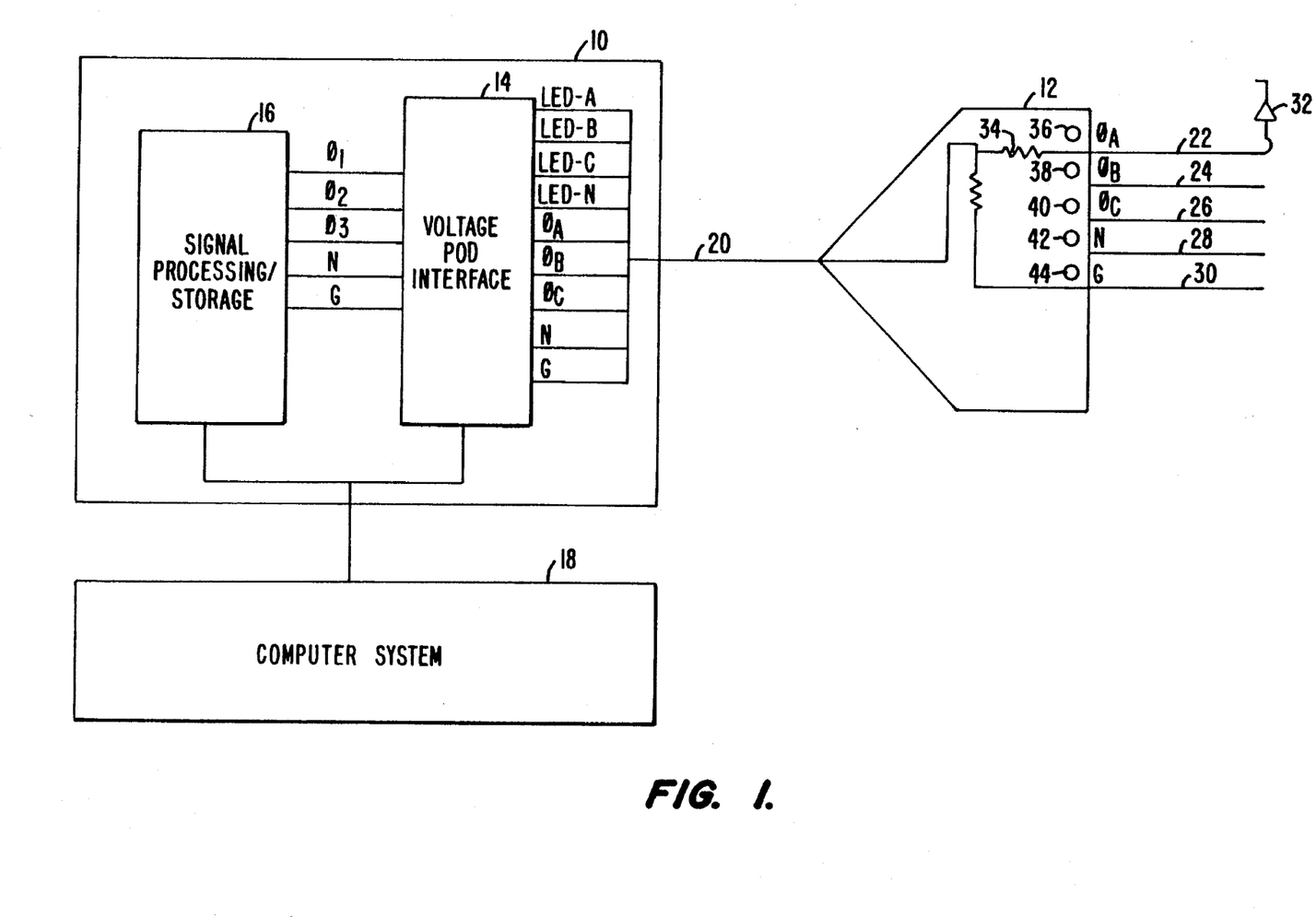
FIG. 1 depicts a power monitoring instrument and associated voltage pod in accordance with the invention.

FIG. 1 depicts a power monitoring instrument 10 and an associated voltage pod 12 in accordance with the invention. The power monitoring instrument 10 includes a voltage pod interface 14 and a signal processing/storage circuit 16. The power monitoring instrument 10 connects to a computer system 18 and is coupled to voltage pod 12 by a four-foot long connecting cable 20. Connecting cable 20 attaches to a hermetically sealed bayonet connector (not shown) on power monitoring instrument 10 which seals before making electrical contact.

Voltage pod 12 is shown configured for three-phase power measurements and includes connections to six-foot long color-coded signal cables 22, 24, 26, 28, and 30 for all three phases of a multi-phase power system as well as a neutral and ground signal respectively. In a single phase configuration of voltage pod 12, two of the signal cables, 24 and 26, could be eliminated. The signal cables terminate in insulated safety connectors which accept various interchangeable voltage probes to allow for connection to different conductors. For example, one type of probe may be used to attach to a threaded stud and another type may be used for exposed conductors. A representative voltage probe 32 is shown attached to signal cable 22. Voltage pod 12 also includes a divider circuit, usually 1000:1, for each of the non-ground signal cables. A representative divider 34 is shown in series with signal cable 22. LEDs 36, 38, 40, 42, and 44 are shown for each of the signal cables.

In operation, signal processing/storage circuit 16 analyzes and stores power quality information derived from the voltages obtained via voltage pod 12. Computer system 18 is employed for further analysis and display of power quality related information.

The use of dividers in voltage pod 12 provides safety advantages in that high voltage is not brought back to power monitoring instrument 10 and connectors on the back of power monitoring instrument 10 may be manipulated freely without fear of shock. Other safety advantages and general convenience are provided by the operation of voltage pod interface 14 in conjunction with voltage pod 12.

Figure 2:
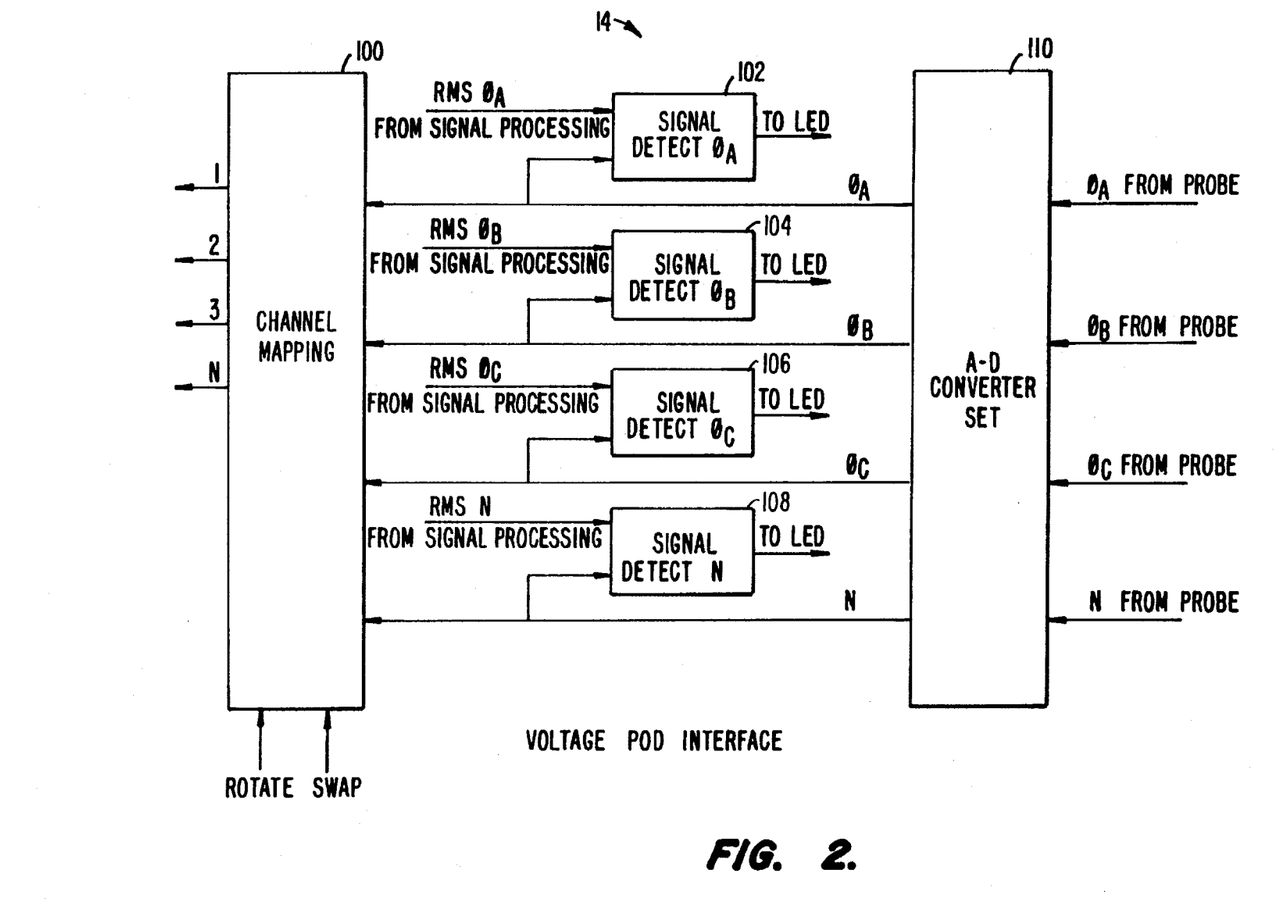
FIG. 2 depicts a representation of a voltage pod interface in accordance with the invention.

FIG. 2 depicts a representation of voltage pod interface 14 in accordance with the invention. Voltage pod interface 14 includes a channel mapper 100, signal detectors 102, 104, 106 and 108, corresponding to the non-ground voltage probes, and A-D converter set 110. In the preferred embodiment, the functions of channel mapper 100 and signal detectors 102, 104, 106, and 108 are performed by routines executed by signal processing/storage circuit 16. A-D converter set 110 incorporates analog-to-digital converters for digitizing the signals arriving from the probes.

Each signal detector operates to activate the appropriate LED on voltage pod 12 upon detection of a signal. If the signal exceeds a first predetermined percentage of the A-D output range, the signal detector flashes the LED. If the signal is below a second predetermined percentage, the LED is turned off. Thus, proper connection can be readily verified while connecting the probes without operator attention to power monitoring instrument 10. The time during which the operator is exposed to high voltage and the accompanying danger of shock is therefore minimized.

Figure 3:
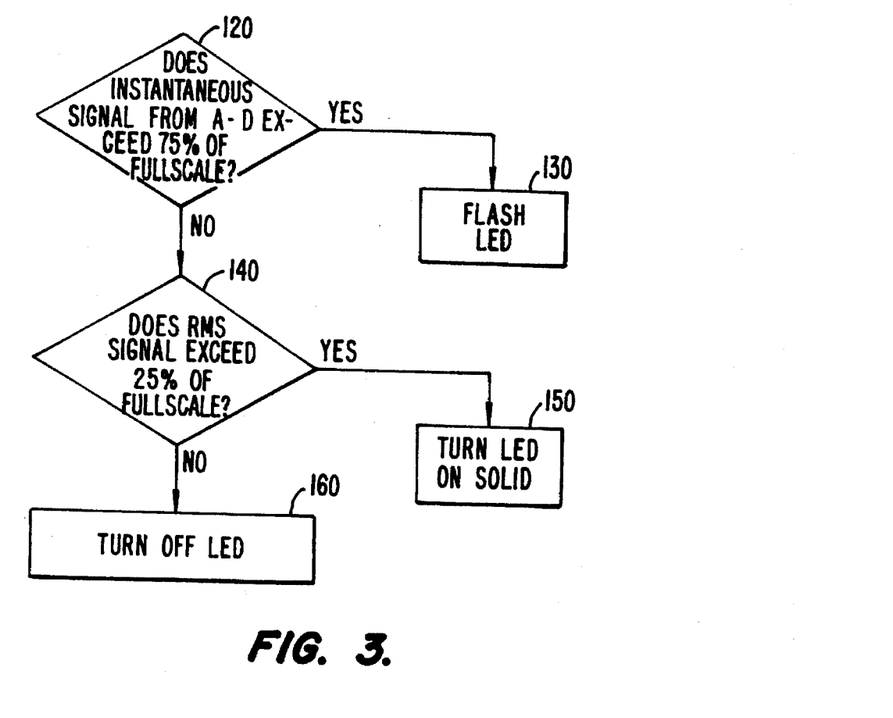
FIG. 3 is a flowchart describing the steps of indicating the presence of a signal on a given voltage probe in accordance with the invention.

FIG. 3 is a flowchart describing the steps of indicating the presence of a signal on a given voltage probe. In the preferred embodiment, these steps are executed by signal processing/storage circuit 16. At step 120, signal processing/storage circuit 16 checks if the instantaneous voltage level coming from the A-D exceeds 75% of full scale. If the signal does in fact exceed 75% of full scale, the LED is flashed at step 130. At step 140, signal processing/storage circuit 16 checks if the rms voltage level of the signal exceeds 25% of full scale. In the preferred embodiment, signal processing/storage circuit 16 determines the rms voltage level by converting the digitized signal into the frequency domain and integrating over the spectrum. If the rms voltage level of the signal does exceed 25% of full scale, the LED is illuminated steadily at step 150. If the rms voltage level of the signal does not exceed 25% of full scale, the LED is turned off at step 160.

Channel mapper 100 allows an operator to correct for inadvertent scrambling of phase connections without further handling of voltage probes. In the preferred embodiment, keyboard commands to computer system 18 alter the mapping between signal cables 22, 24, 26, 28 and 30 and monitoring channels of signal processing/storage circuit 16.

Figure 4A:
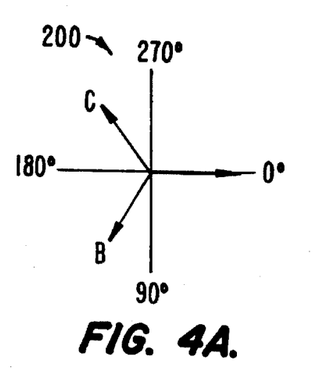
FIG. 4A depicts a phasor diagram display wherein voltage probes and phase conductors of a three-phase power system are properly connected.
Figure 4B:
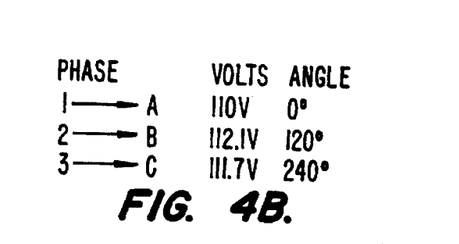
FIG. 4B depicts voltages and angles for the phasor diagram of FIG. 4A.
Figure 4C:
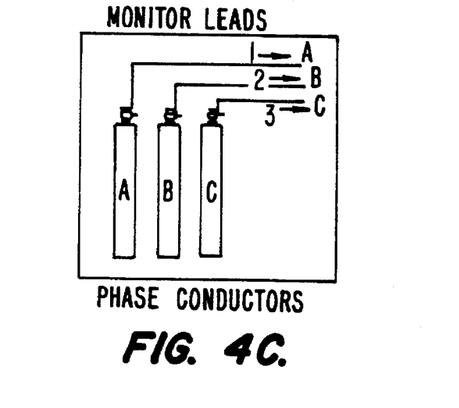
FIG. 4C depicts the connection of voltage probes to phase conductors to produce the display of FIG. 4A.

FIG. 4A depicts a phasor diagram display 200 wherein voltage probes and phase conductors of a three-phase power system are properly connected. FIG. 4B depicts voltages and angles for the phasor diagram of FIG. 4A. FIG. 4C depicts the connection of voltage probes to phase conductors to produce the display of FIG. 4A. Phasor diagram display 200 is generated by signal processing/storage circuit 16 or computer system 18 and is displayed by computer system 18. Distribution panels are typically wired such that conductor phases are A, B, C, from left to right when looking at the panel.

Signal/processing storage circuit 16 has inputs for three channels 1, 2, and 3. The display shows three vectors, representing the three phase signals respectively. Channel 1 is labeled as A, channel 2 is labeled as B, channel 3 is labeled as C, corresponding to typical distribution panel labeling. Convention dictates that the vectors rotate counter clockwise; first, phase A goes through 0 degrees, next phase B, and finally phase C. The vector of each phase is displaced from its adjacent phase by 120 degrees; therefore, the vector sum of three equally balanced phases is zero.

Figure 5A:
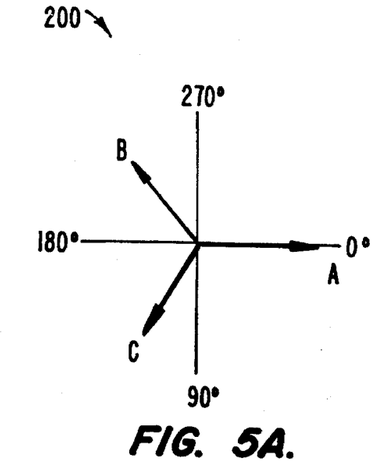
FIG. 5A depicts a phasor diagram display wherein voltage probes have been inadvertently swapped between phases.
Figure 5B:
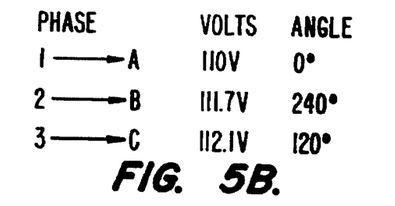
FIG. 5B depicts voltages and angles for the phasor diagram of FIG. 5A.
Figure 5C:
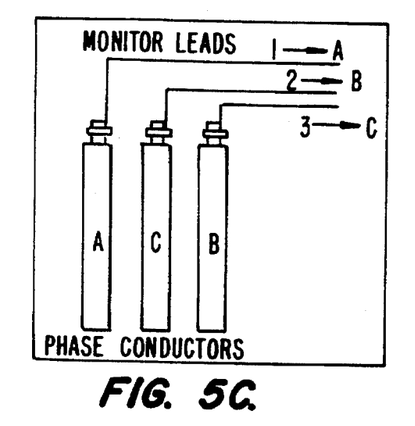
FIG. 5C depicts the connection of voltage probes to phase conductors to produce the display of FIG. 5A.

FIG. 5A depicts phasor diagram display 200 wherein connections for phases B and C have been accidentally reversed. FIG. 5B depicts voltages and angles for the phasor diagram of FIG. 5A. FIG. 4C depicts the connection of voltage probes to phase conductors to produce the display of FIG. 5A. In the prior art, correction of this error would require the operator to physically swap the voltage probes for phases B and C.

Figure 6A:
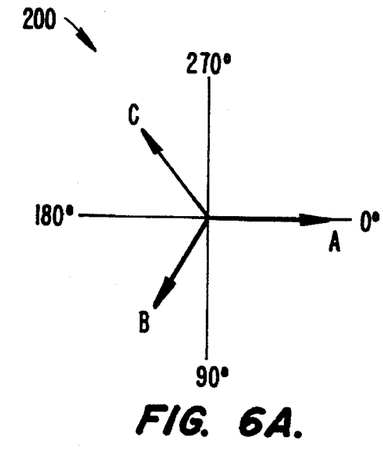
FIG. 6A depicts how phase connection errors may be corrected in accordance with the invention by using a Swap operator.
Figure 6B:
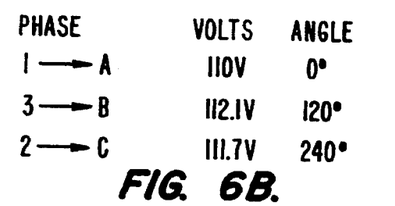
FIG. 6B depicts voltages and angles for the phasor diagram of FIG. 6A.
Figure 6C:
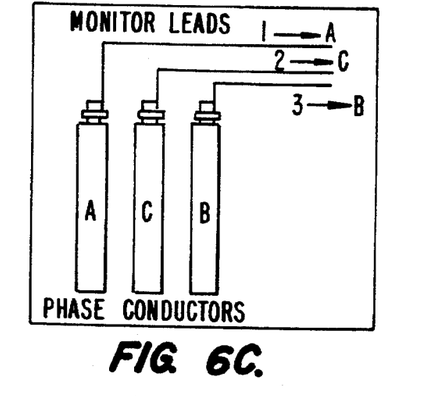
FIG. 6C depicts the connection of voltage probes to phase conductors to produce the display of FIG. 6A.

FIG. 6A depicts phasor diagram display 200 wherein reversal of phase connections has been corrected in accordance with the invention. FIG. 6B depicts voltages and angles for the phasor diagram of FIG. 6A. FIG. 6C depicts the connection of voltage probes to phase conductors to produce the display of FIG. 6A. The operator may apply a Swap operator to phases B and C by appropriate input to computer system 18. Computer system 18 then directs channel mapper 100 to couple the phase B input to channel 3 of signal/processing storage circuit 18 and the phase C input to channel 2 of signal/processing storage circuit 18. The result is that phases A, B, and C appear in their desired locations on phasor diagram display 200 without inconvenient operator handling of probes and the accompanying exposure to high voltage.

Figure 7A:
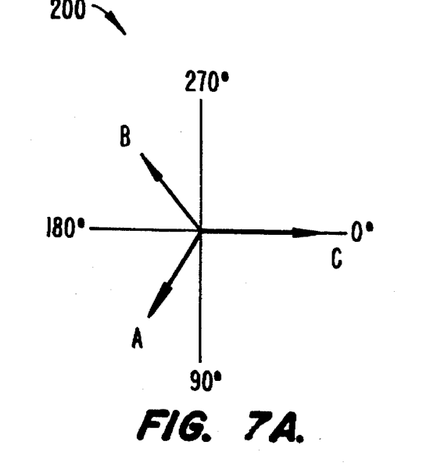
FIG. 7A depicts a phasor diagram display wherein voltage probes have been inadvertently rotated among phases.
Figure 7B:
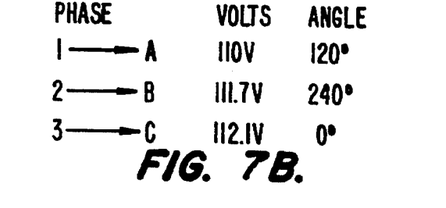
FIG. 7B depicts voltages and angles for the phasor diagram of FIG. 7A.
Figure 7C:
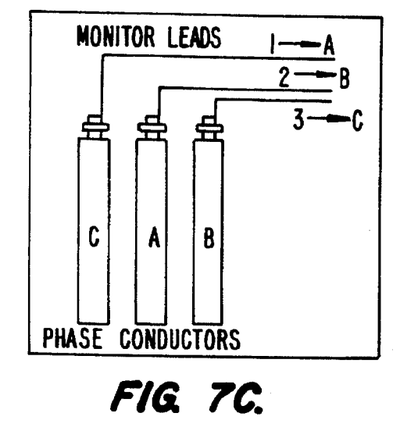
FIG. 7C depicts the connection of voltage probes to phase conductors to produce the display of FIG. 7A.

FIG. 7A depicts phasor diagram display 200 for an installation wherein voltage probe connections for phases A, B, and C have been incorrectly connected so that the vectors appear rotated from their correct position. FIG. 7B depicts voltages and angles for the phasor diagram of FIG. 7A. FIG. 7C depicts the connection of voltage probes to phase conductors to produce the display of FIG. 7A. In the prior art, correction of this error would have required the operator to reposition three voltage probes.

Figure 8A:
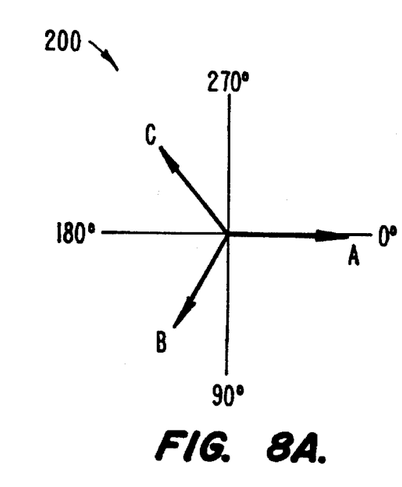
FIG. 8A depicts how phase connection errors may be corrected in accordance with the invention by using a Rotate operator.
Figure 8B:
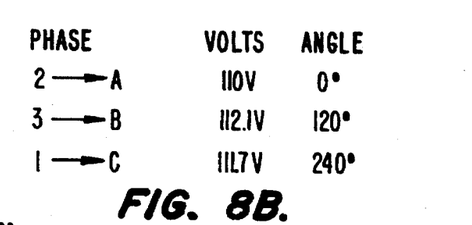
FIG. 8B depicts voltages and angles for the phasor diagram of FIG. 8A.
Figure 8C:
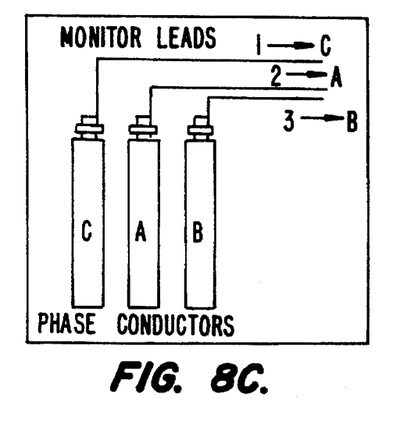
FIG. 8C depicts the connection of voltage probes to phase conductors to produce the display of FIG. 8A.

FIG. 8A depicts a phasor diagram showing how the phase connection error of FIG. 7A may be corrected in accordance with the invention by using a Rotate operator. The operator applies a Rotate operator by appropriate input to computer system 18. Computer system 18 then directs channel mapper 100 to couple the A phase input to channel 2, the B phase input to channel 3, and the C phase input to channel 1. Again, the result is correction of the connection error without further handling of voltage probes. Any scrambling of voltage probes among phase conductors can be corrected through successive applications of the Rotate and Swap operators.

Figure 9:
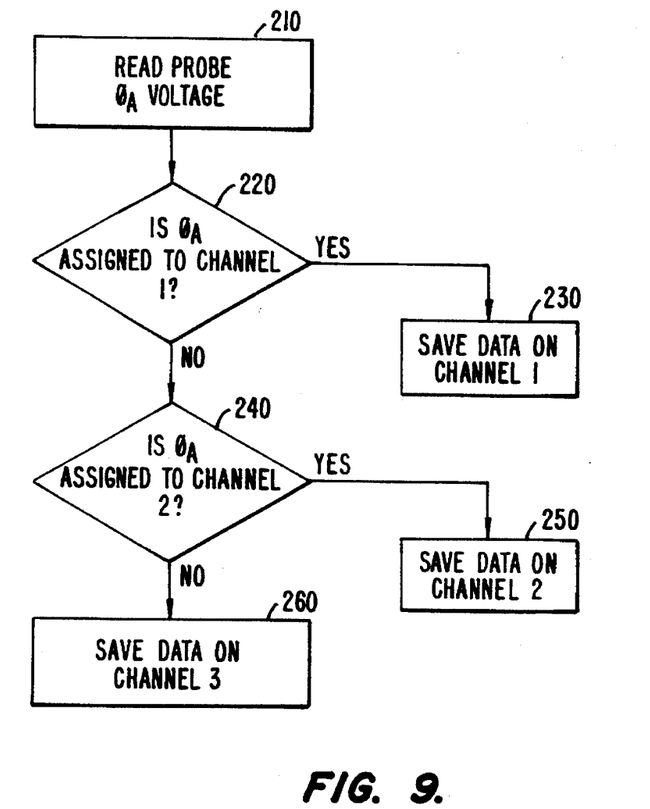
FIG. 9 is a flowchart describing the steps of assigning voltage data to the proper channel in accordance with the invention.

FIG. 9 is a flowchart describing the steps of assigning voltage data to the proper channel in accordance with the invention, thus implementing the functionality of depicted channel mapper 100. The flowchart is drawn in reference to the probe for phase A, but the same steps are followed for each phase. At step 210, signal processing/storage circuit 16 reads the voltage on the phase A probe. At step 220, signal processing/storage circuit 16 determines whether phase A is assigned to channel 1 as it would be if no Rotate or Swap operator had been entered as input to computer system 18. If phase A has been assigned to channel 1, signal processing\storage circuit 16 stores the phase A data on channel 1 for further processing at step 230. If phase A has not been assigned to channel 1, signal processing storage circuit 16 determines whether phase A is assigned to channel 2 as a result of the operation of Rotate and/or Swap operators at step 240. If phase A has been assigned to channel 2 signal processing/storage circuit 16 stores the phase A data on channel 2 for further processing at step 250. If phase A has not been assigned to channel 1 or channel 2, at step 260, signal processing storage circuit 16 stores the phase A data on channel 3.

Figure 10:
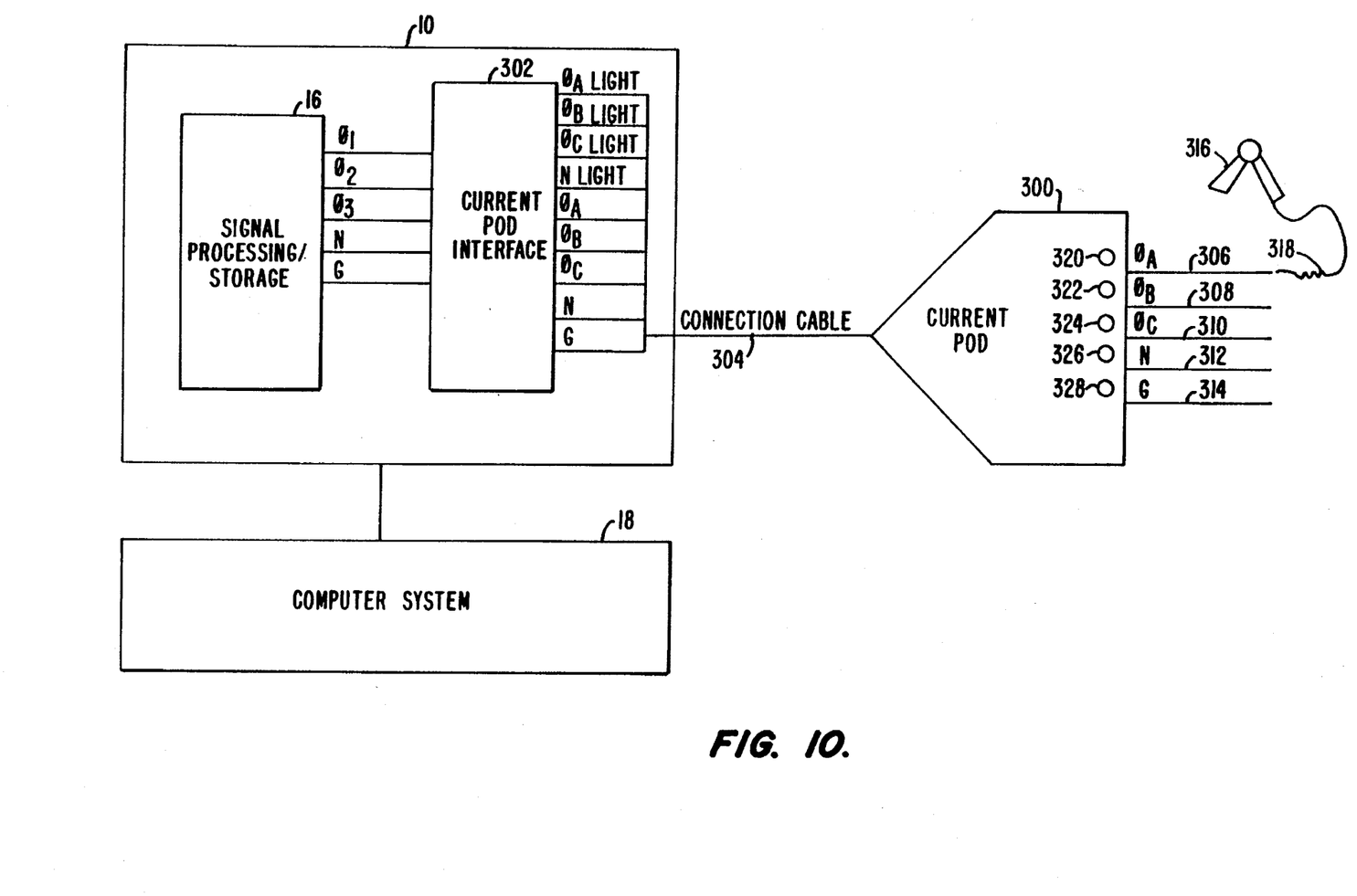
FIG. 10 depicts the power monitoring instrument and associated current measurement pod in accordance with the invention.

FIG. 10 depicts power monitoring instrument 10 and an associated current pod 300 in accordance with the invention. Power monitoring instrument 10 includes signal processing/storage circuit 16 and a current pod interface 302.

Power monitoring instrument 10 is coupled to current pod 300 by a four-foot long connection cable 304. Connection cable 304, like connection cable 20, attaches to a hermetically sealed bayonet connector (not shown) on power monitoring instrument 10 which seals before making electrical contact.

Current pod 300 is shown configured for three-phase power measurements and includes connections to six-foot long color-coded signal cables 306, 308, 310, 312, 314 for all three phases of a three-phase power system as well as a neutral and ground signal respectively. In a single phase configuration of current pod 200, two of the signal cables, 308 and 310, could be eliminated. The signal cables may couple to current clamps with 5 A, 40 A, 1000 A, and 3000 A ranges. A resistor built into a connector of each current clamp identifies the clamp and sets the correct display range. A burden is also built into each current clamp to prevent high voltage shocks should the clamp become unattached from the signal cable while still connected to an energized conductor. A representative current clamp 316 is shown attached to signal cable 306 via a resistor 318. Green LEDs 320, 322, 324, and 326 mounted on current pod 300 are shown for each of the signal cables except ground signal cable 314 which has a red LED 328.

In operation, signal processing/storage circuit 16 analyzes and stores power quality information derived from the current measurements obtained via current pod 300. By integrating current measurements from current pod 300 with voltage measurements from voltage pod 12, power monitoring instrument 10 is able to determine source impedances and load impedances for a power system.

Figure 11:
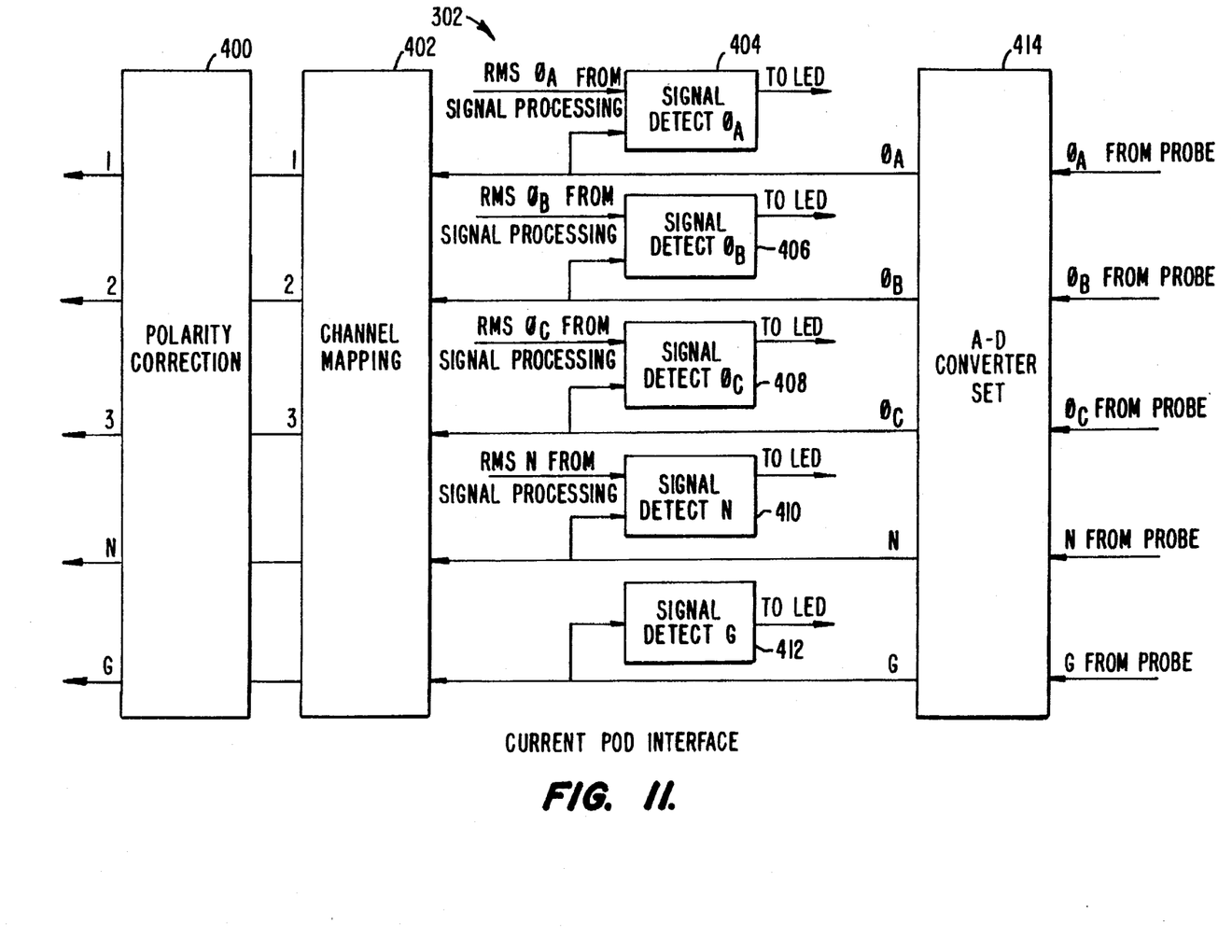
FIG. 11 depicts a representation of a current pod interface in accordance with the invention.

FIG. 11 depicts a representation of current pod interface 302 in accordance with the invention. Current pod interface 302 includes a polarity correction unit 400, a channel mapper 402, signal detectors 404, 406, 408, 410, 412 corresponding to the current clamps coupled to signal cables 306, 308, 310, 312, and 314, and an A-D converter set 414. A-D converter set 414 incorporates analog-to-digital converters for digitizing the signals arriving from the clamps. In the preferred embodiment, the functions of polarity correction unit 400, channel mapper 402, and signal detectors 404, 406, 408, 410, and 412 are performed by software routines executed by signal processing/storage circuit 16.

Each signal detector operates to activate the appropriate LED on current pod 300 upon detection of a signal. For the non-ground signals, if the signal exceeds a first predetermined percentage of the A-D output range, the signal detector flashes the LED. If the signal is below a second predetermined threshold, the LED turns off. The LED for the ground signal cable turns on if more than 0.5 A of ground current is flowing. Thus, proper selection and connection of current clamps can be conveniently verified while viewing the pod without attention to power monitoring instrument 10 or a display of computer system 18 which may not be within easy reach. Again, the time during which the operator is exposed to high voltage and the accompanying danger of shock is thus minimized. The software routines executed by signal\processing storage circuit 16 to implement the functions of the non-ground signal detectors are similar to the routines described in reference to FIG. 3.

As in voltage pod interface 12, channel mapper 402 allows an operator to correct for inadvertent scrambling of phase connections without further handling of current clamps. Phases are normally rotated and swapped in pairs such that both voltage and current are changed simultaneously. If the operator must assign a current phase to a different voltage phase, current phases can be swapped and rotated independently of the initial voltage phase assignment. However, if any current and voltage pair are separated, all power measurements will be flagged prior to storage or display.

For current measurements, another kind of connection error can be made, incorrectly orienting a current clamp on a conductor. The consequence of this error is that measured current will have the wrong polarity. In the prior art, this error was corrected by physically reorienting the current clamp.

Figure 12A:
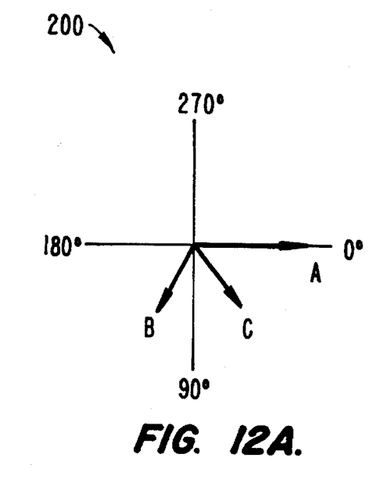
FIG. 12A depicts a phasor diagram display wherein an error has been made in orienting a current clamp.
Figure 12B:
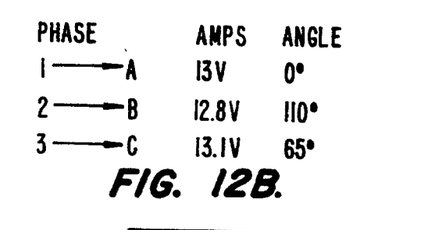
FIG. 12B depicts currents and angles for the phasor diagram of FIG. 12A.
Figure 12C:
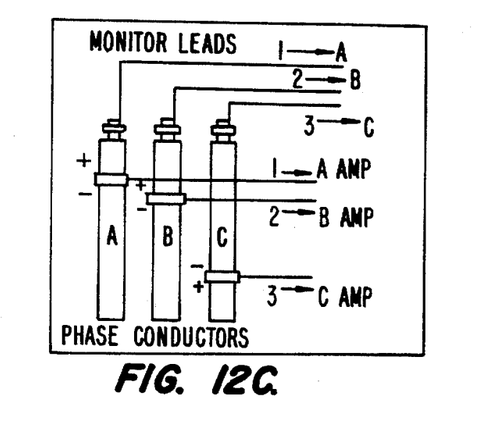
FIG. 12C depicts the connection of current probes to phase conductors to produce the display of FIG. 12A.

FIG. 12A depicts phasor diagram display 200 wherein an error has been made in orienting a current clamp. FIG. 12B depicts voltages and angles for the phasor diagram of FIG. 12A. FIG. 12C depicts the connection of voltage probes to phase conductors to produce the display of FIG. 12A. The current clamp for phase C has been misoriented.

Figure 13A:
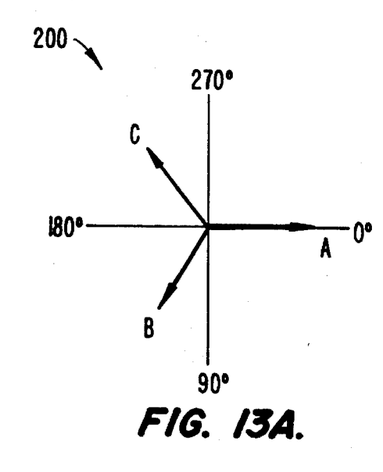
FIG. 13A depicts how polarity errors made in orienting current clamps may be corrected in accordance with the invention by using an Invert operator.
Figure 13B:
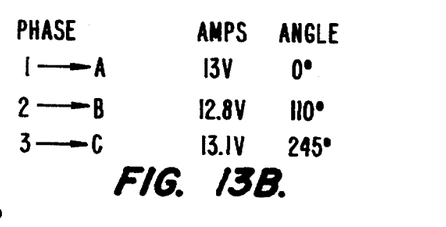
FIG. 13B depicts currents and angles for the phasor diagram of FIG. 13A.
Figure 13C:
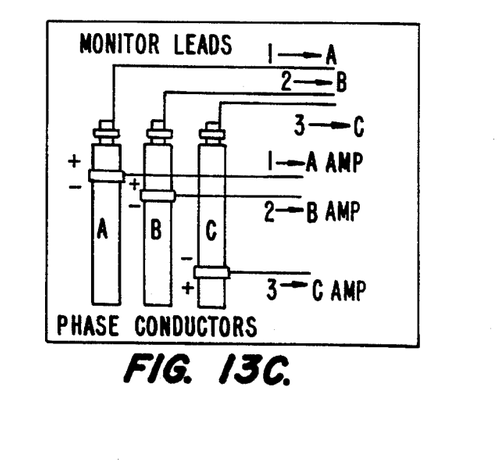
FIG. 13C depicts the connection of current probes to phase conductors to produce the display of FIG. 13A.

FIG. 13A depicts a phasor diagram showing how polarity errors made in orienting current clamps may be corrected in accordance with the invention by using an Invert operator. FIG. 13B depicts currents and angles for the phasor diagram of FIG. 13A. FIG. 13C depicts the connection of current probes to phase conductors to produce the display of FIG. 13A. The operator applies an Invert operator to channel 3, by appropriate input to computer system 18. The Invert operator is an input to polarity correction unit 400 which responds by flipping the polarity of channel 3. Again, the adjustment is performed without returning to the monitoring points.

Figure 14:
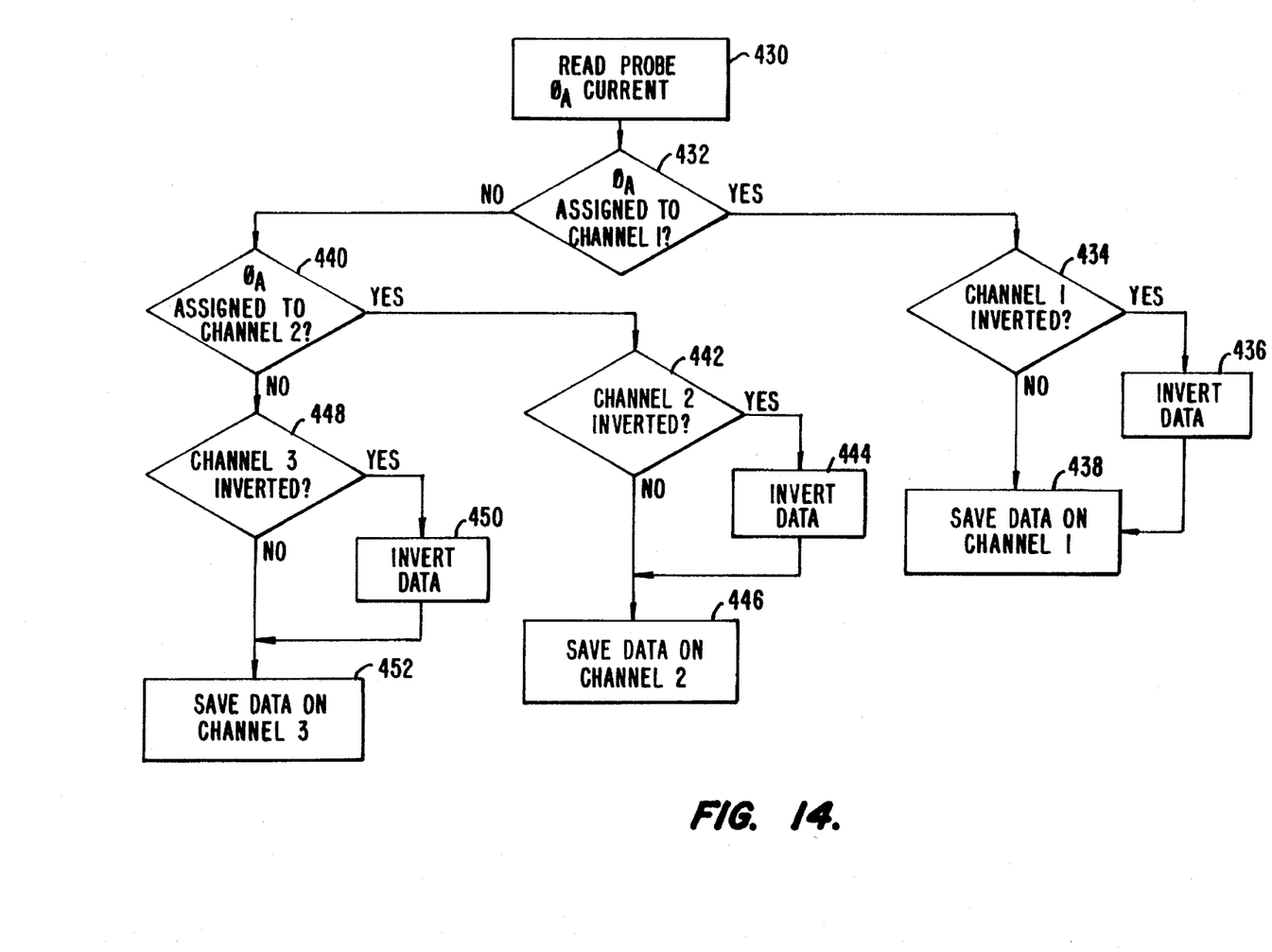
FIG. 14 is a flowchart describing the steps of assigning current data to the proper channel while correcting for polarity errors in accordance with the inventions.

FIG. 14 is a flowchart describing the steps of assigning current data to the proper channel while correcting for polarity errors, thus implementing the functions of polarity correction unit 400 and channel mapper 402. The flowchart is drawn in reference to the probe for phase A, but the same steps are followed for each phase. At step 430, signal processing/storage circuit 16 reads the voltage on the phase A probe. At step 432, signal processing/storage circuit 16 determines whether phase A is assigned to channel 1 as it would be if no Rotate or Swap operator had been entered as input to computer system 18. If phase A has been assigned to channel 1, signal processing/storage circuit 16 then determines if an Invert operator has been applied to channel at step 434. If an Invert operator has been applied to channel 1, the data from the phase A probe is inverted at step 436 to correct polarity. Whether or not an Invert operator has been applied to channel 1, the phase A data is stored on channel 1 for further processing at step 438.

If phase A has not been assigned to channel 1, signal processing storage circuit 16 determines whether phase A is assigned to channel 2 as a result of the operation of Rotate and/or Swap operators at step 440. If phase A has been assigned to channel 2, signal processing/storage circuit 16 then determines whether an Invert operator has been applied to channel 2 at step 442. If an Invert operator has been applied to channel 2, the data from the phase A probe is inverted at step 444. Whether or not an Invert operator has been applied to channel 2, the phase A data is stored on channel 2 for further processing at step 446.

If phase A has not been assigned to channel 1 or channel 2, signal processing storage circuit 16 determines whether an Invert operator has been applied to channel 3 at step 448. If an Invert operator has been applied to phase 3, the phase A data is inverted at step 450. Whether or not an Invert operator has been applied, signal processing storage circuit 16 stores the phase A data on channel 3 for further processing at step 452.

Figure 15:
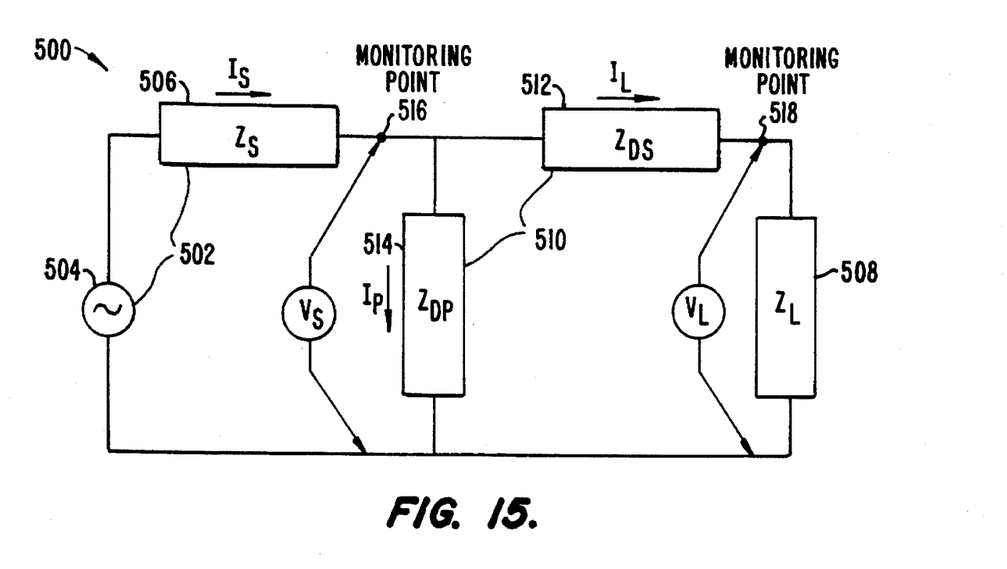
FIG. 15 depicts an impedance diagram of a power system as displayed in accordance with the invention.

FIG. 15 depicts an impedance diagram 500 of a power system as displayed in accordance with the invention. A power source 502 is modeled as a combination of an ideal (zero impedance) power source 504 and a source impedance ($Z_s$) 506. A load is modelled as a load impedance ($Z_L$), 508. The distribution system 510 for feeding power from the power source 502 to the load 508 is modeled as a series distribution impedance ($Z_{DS}$) 512 and a parallel distribution impedance ($Z_{DP}$) 514. The diagram depicts monitoring points 516 and 518 for monitoring voltage and current in the course of evaluating the depicted impedances.

Figure 16:
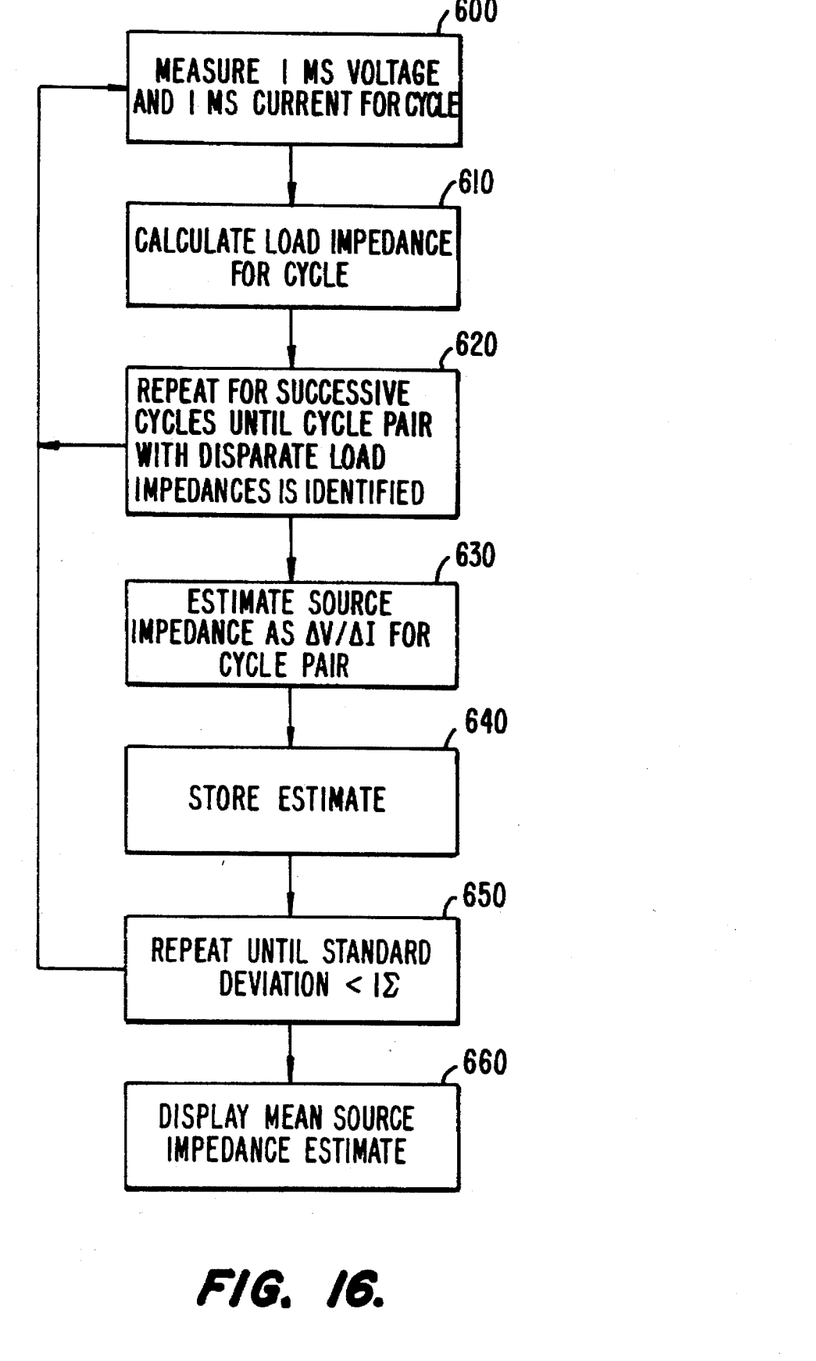
FIG. 16 is a flowchart describing the steps of calculating source impedance in accordance with the invention.

FIG. 16 is a flowchart describing the steps of calculating source impedance in accordance with the invention. To determine the source impedance for the power source, the operator connects voltage probes and current clamps coupled to power monitoring instrument 10 at monitoring point 516 to measure the voltage and current outputs of power source 502. Unlike in prior art techniques, there is no necessity to disconnect load 508.

At step 600, signal processing/storage circuit 16 within power monitoring instrument 10 measures rms voltage and rms current for a particular cycle. In the preferred embodiment, the rms measurements are obtained by sampling a cycle of the voltage and current signals, digitizing the samples, transforming the samples into the frequency domain, and then integrating over the frequency spectrum to obtain the rms values.

At step 610, signal processing/storage circuit 16 calculates a load impedance for the given cycle by dividing the measured rms voltage by rms current. Load impedance as measured at monitoring point 516 will ordinarily vary over time in response to incidental load variations caused by equipment cycling on and off and other variations in load current requirements. At step 620, power monitoring instrument will repeat steps 600 and 610 until two cycles with disparate load impedances are identified. In the preferred embodiment, a 10% difference in load impedances is considered useful for calculating source impedance.

At step 630, signal processing/storage circuit 16 estimates a source impedance by calculating the ratio of rms voltage change over rms current change for the identified two cycles with disparate load impedances. At step 640, this estimate is stored.

At step 650, steps 600, 610, 620, 630, and 640 are repeated to generate successive estimates. Statistical data is generated and maintained for the successive estimates and when the standard deviation falls below one sigma, the mean of the estimates is displayed by computer system at step 660. Thus, source impedance 506 is measured without altering the interconnections between the source 502 and load 508.

Figure 17:
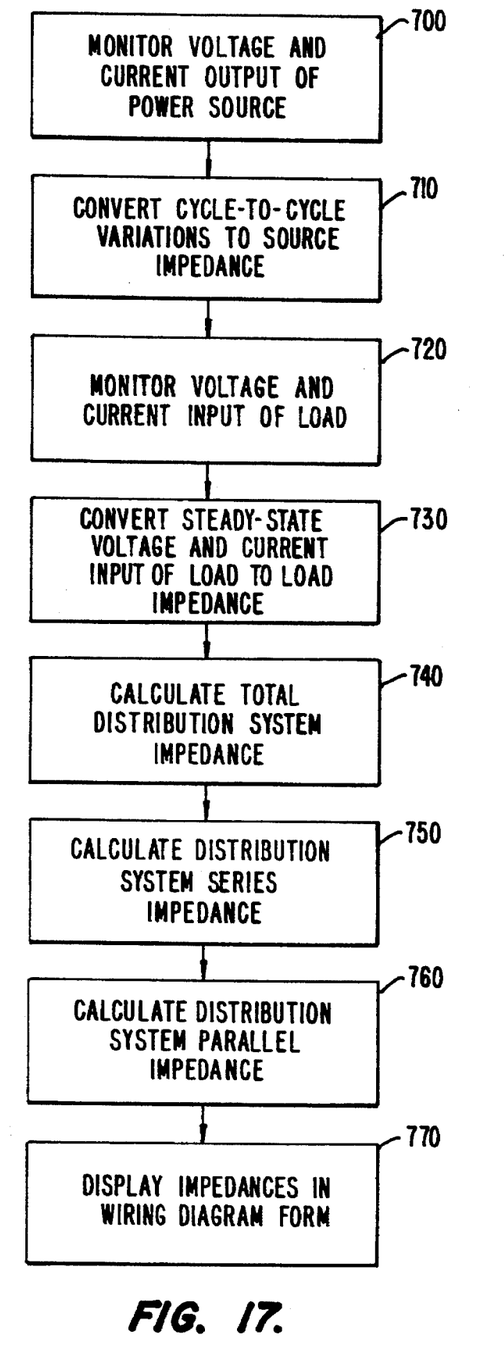
FIG. 17 is a flowchart describing the steps of generating an impedance diagram display in accordance with the invention.

FIG. 17 is a flowchart describing the steps of generating impedance diagram display 500 in accordance with the invention. Power monitoring instrument 10 can generate the wiring diagram of FIG. 15 for display by computer system 18 from measurements of voltage and current at monitoring points 516 and 518.

The operator first couples voltage probes and current clamps to monitoring point 516. Signal processing/storage circuit 16 monitors the voltage and current output of power source 502 at step 700. At step 710, signal processing/storage circuit 16 evaluates the source impedance from cycle-to-cycle variations of voltage and current output of power source 502 as described in connection with FIG. 16.

The operator then couples voltage probes and a current clamp to monitoring point 518 so that power monitoring instrument 10 can monitor the voltage and current inputs of load 508 at step 720. At step 730, signal processing/storage circuit 16 divides a long-term mean rms input voltage by a long-term mean rms input current to obtain the load impedance.

At step 740, signal processing/storage circuit 16 estimates an apparent source impedance as measured at the load using the techniques described in connection with FIG. 16. This value is subtracted from the source impedance value obtained in step 720 to derive a total distribution system impedance ($Z_D$). At step 750, the distribution system series impedance ($Z_{DS}$) 510 is derived from the formula $Z_{DS}=Z_D(2I_L-I_S)/I_L$. At step 760, distribution system parallel impedance ($Z_{DP}$) 512 is derived by subtracting $Z_{DS}$ from the total impedance for distribution system 510. At step 770, the wiring diagram 500 of FIG. 15 is displayed by computer system 18 with the calculated values for the depicted impedance elements.

The invention has now been explained with reference to specific embodiments. Other embodiments will be apparent to those of ordinary skill in the art upon reference to the foregoing description. For example, the functionality of power monitoring instrument 10 and computer system 18 could be incorporated into a single apparatus. It is therefore not intended that this invention be limited, except as indicated by the appended claims.

What is claimed is:

1. A method for displaying a wiring diagram of a power system including a power source, a load, and distribution system for coupling the power source to the load, said method comprising the steps of:

detecting the rms voltage and rms current output of the power source using a voltage probe and a current clamp; thereafter converting cycle-to-cycle variations in rms voltage output and rms current output of the power source caused by incidental load variations to a source impedance of the power source;

detecting the voltage input and current input of the load;

converting steady-state measurements of the voltage input and current input of the load to a load impedance;

calculating a parallel distribution system impedance from a steady-state measurement of current output of the source, the steady-state measurement of current input of the load, the cycle-to-cycle variation in the rms voltage output and rms current output of the power source caused by incidental load variations, and cycle-to-cycle variations in the rms voltage input and rms current input of the load caused by incidental load variations; and calculating a series distribution system impedance from the steady-state measurement of current output of the source, the steady-state measurement of current input of the load, cycle-to-cycle variation in the rms voltage output and rms current output of the source caused by incidental load variations, and the cycle-to-cycle variations in the rms voltage input and rms current input of the load caused by incidental load variations; and thereafter displaying the source impedance, load impedance, parallel distribution system impedance, and series distribution system impedance in the form of a wiring diagram.

* * * * *